United States Patent
Williams et al.

(10) Patent No.: US 7,023,005 B2
(45) Date of Patent: Apr. 4, 2006

(54) GAIN COMPENSATION FOR OPTOCOUPLER FEEDBACK CIRCUIT

(75) Inventors: David A. Williams, Glen Ellyn, IL (US); Michael G. Amaro, Naperville, IL (US)

(73) Assignee: Texas Instruments Incorporated, Dallas, TX (US)

( * ) Notice: Subject to any disclaimer, the term of this patent is extended or adjusted under 35 U.S.C. 154(b) by 792 days.

(21) Appl. No.: 10/027,648

(22) Filed: Dec. 21, 2001

(65) Prior Publication Data

US 2003/0117698 A1  Jun. 26, 2003

(51) Int. Cl.
*G02B 27/00* (2006.01)

(52) U.S. Cl. ............................. 250/551; 250/214 AG; 323/280

(58) Field of Classification Search ............... 250/551, 250/214 AG, 214 C, 214 A; 323/280
See application file for complete search history.

(56) References Cited

U.S. PATENT DOCUMENTS

| | | | |
|---|---|---|---|
| 5,387,822 A | * | 2/1995 | Martin-Lopez et al. ..... 307/125 |
| 5,949,225 A | * | 9/1999 | Sawtell ....................... 323/284 |

* cited by examiner

*Primary Examiner*—Seung C. Sohn
(74) *Attorney, Agent, or Firm*—W. Daniel Swayze, Jr.; W. James Brady; Frederick J. Telecky, Jr.

(57) ABSTRACT

A feedback circuit has an optical coupler with a feedback gain control. The feedback gain control includes an active element connected to vary current flow depending on changes in gain of the optical coupler.

4 Claims, 6 Drawing Sheets

GAIN COMPENSATION FOR OPTOCOUPLER FEEDBACK CIRCUIT

BACKGROUND OF THE INVENTION

1. Field of the Invention

The present invention relates generally to an optical coupler circuit, and, in particular, to a gain compensation circuit for an optical coupler.

2. Description of the Related Art

Optical coupler circuits, also referred to as optically coupled isolator devices or optocouplers, provide isolation between different circuit portions which, for example, operate at vastly different voltages. An optocoupler typically includes a light source, such as an LED, at one side and a light sensor, such as a phototransistor or a photodiode, at the other side. Changing light levels from the LED traverses a gap and are received by the light sensor. The imaginary division between the circuit portions operating at the two different voltages is referred to as an isolation barrier and the optocoupler communicates across this isolation barrier. The current gain of an optical coupler between the input and the output is referred to as the current transfer ratio (CTR) of the optical coupler. The CTR is the ratio of the output current which is the same as the collector current to the input current which is the current exciting the LED.

Optocouplers are commonly used in switched-mode power supplies and other analog circuits to provide an analog feedback control signal across the isolation barrier. Optocouplers are used because they are small, simple, easy to use, and reliable. On the other hand, optical couplers have large initial gain variations. The initial gain variation can occur from device to device or from production lot to production lot in typical optical couplers. The CTR range variation introduces undesirable variations in performance and capability of a circuit that must transmit information across the isolation barrier.

A potential solution to this problem is to actively trim a gain setting resistor to null out the initial CTR (Current Transfer Ratio) variations. A typical optocoupler feedback circuit has an overall circuit gain that is proportional to the current transfer ratio of the optocoupler divided by the impedance of the setting resistor. Thus, varying the resistor impedance value will adjust for variations in the optocoupler gain.

An example of a circuit utilizing such active trimming is shown in FIG. 1, including a power supply 10 with an optocoupler feedback circuit 12. The power supply 10 is illustrated only generally for purposes of simplicity and includes an input 14 for an input voltage $V_{in}$, a power transformer 16, and a rectifier and filter 18 at the secondary side of the transformer 16. A DC output voltage $V_{out}$ is produced at the output of the rectifier and filter 18 and is available at 20.

The high and low voltage portions of the power supply are separated by an isolation barrier 22, an imaginary boundary indicated in the drawing by a line. An optocoupler 24 is used to communicate a feedback signal across the isolation barrier 22 so that the output voltage $V_{out}$ of the power supply can be precisely regulated. In the feedback circuit, the optocoupler 24 is driven from an error amplifier circuit which includes the light emitting diode 26 of the optocoupler 24, an npn transistor 28, and a trim resistor 30, as well as a operational amplifier 32 driving the base of the transistor 28. The operational amplifier 32 receives the output voltage $V_{out}$ through a voltage divider of resistors 34 and 36 at the non-inverting input 38, while a reference voltage $V_{ref}$ at 40 is fed through a resistor 42 to the inverting input 44. The inverting input 44 of the operational amplifier 32 also receives the voltage across the trim resistor 30 via a capacitor 46. A test point 48 is provided at which the voltage across the trim resister 30 is measured.

On the input side of the circuit, on the other side of the isolation barrier 22, a phototransistor or photodiode 50 of the optocoupler 24 is connected to a second trim resistor 52 as well as to the input of an error amplifier, pulse width modulator and driver circuit 54. The circuit 54, while having multiple functions, is available on a single chip. The output of the error amplifier, pulse width modulator and driver circuit 54 is fed to the power transformer 16, potentially through a switch (not shown). An input test point 56 is utilized to measure the voltage across the trim resistor 52.

The error amplifier compares the output voltage 20 against the reference voltage 40 in the operational amplifier 32 and produces an error voltage at 58 to provide closed loop regulation of the power supply. The error voltage 58 is converted to a current by the transistor 28 and the trim resistor 30. This current is transferred across the isolation barrier 22 by the optocoupler 24, where it is converted back to a voltage at the trim resistor 52.

The voltage gain of the optocoupler circuit 12 is determined from the ratio of the test point 48 to the test point 56. The test point 48 is the feedback error voltage and the point 56 is the pulse width modulation control voltage of the circuit 54. The voltage gain Av is determined from the equation $$Av = \frac{V56}{V48} = \frac{CTR \cdot R52}{R30},$$

wherein V56 is the voltage at test point 56, V48 is the voltage at test point 48, R52 is the resistance of the resistor 52, R30 is the resistance of the resistor 30 and CTR is the current transfer ratio of the optocoupler 24.

The circuit of FIG. 1 is used with an active laser trimming process to eliminate performance sensitivity to initial gain (CTR) variations associated with the optocoupler circuit. The active laser trimming process adjusts the resistors 30 and 52 depending on the initial current transfer ratio of the optocoupler 24. By trimming the resistor 52 to a higher resistance, an adjustment is made to increase the gain for low current transfer ratio optocouplers, and by trimming the resistor 30 to a higher resistance, an adjustment is made in the gain for high current transfer ratio optocouplers. Thus, the voltage gain of the circuit is set to the desired level by compensating for initial variations in the current gain (CTR) of the optocoupler.

However, the current transfer ratio of the optocoupler increases or decreases with changes in temperature, and it also suffers a degradation over the life of the device. Over the typical life of an optocoupler, a loss of 30 to 50 percent of the gain can be expected. The drivers for optocouplers permit feedback loop crossover frequencies to vary as the gain of the optocoupler varies. Lower performance from the isolated feedback loop results, along with a degraded performance of the optocoupler. No adjustment is made for changes in the current transfer ratio due to changes resulting from temperature variations or aging. Instead, a margin for error for these changes is built into the circuit. Even in light of this, the gain of the feedback circuit changes with the age and temperature.

Referring to FIG. 4, an embodiment of an optocoupler feedback circuit is shown without the power supply. The illustrated circuit includes the optical coupler 24 connected to a shunt regulator 100. The shunt regulator 100 regulates the operating current of the optocoupler 24 as necessary to keep the output voltage $V_{out}$ constant. As the output voltage $V_{out}$ increases, the current through the shunt regulator 100 and through the light emitting diode 26 of the optocoupler 24 increases, thereby producing a larger feedback signal at the test point 56. A capacitor 101 may be connected between the control lead and the cathode of the shunt regulator 100.

A control circuit, such as shown in FIG. 1, attached at the test point 56 lowers the power supply duty cycle. This causes a slight decrease in the output voltage $V_{out}$ and keeps the output voltage in regulation. The output voltage $V_{out}$ is connected at 102 to a voltage divider made up of resistors 104 and 106, the midpoint of which is connected to the control lead of the shunt regulator 100.

A resistor 108 is between the optocoupler 24 and the power supply voltage at 110, which in this case is the output voltage $V_{out}$. The low voltage test point 48 is between the resistor 108 and the optocoupler 24. On the other side of the isolation barrier 22, the light sensor 50 of the optocoupler 24 is connected to the resistor 52 to define the voltage at the test point 56.

The voltage gain in the circuit illustrated in FIG. 4 from the test point 48 to the test point 56 is $$Av = \frac{V56}{Vout - V48} = \frac{R52 \cdot CTR}{R108},$$

wherein Vout is the voltage at 102 and 110, V56 is the voltage at the test point 56, V48 is the voltage at the test point 48, R52 is the resistance of the resistor 52, R108 is the resistance of the resistor 108, and CTR is the current transfer ratio of the optocoupler 24.

Typically, in feedback loops with a shunt regulator 100 as the voltage regulating device, the current transfer ratio of the optocoupler 24 is not compensated. The current transfer ratio rating of the optical coupler 24 is incorporated into the circuit. However, this results in feedback loop variations that yield a gain variation in the circuit of 10 to 20 dB, and a corresponding feedback loop frequency crossover that varies by as much as a factor of 10.

SUMMARY OF THE INVENTION

The present invention provides gain compensation in the feedback loop of an optical coupler. The optical coupler circuit varies the gain to give the same feedback loop crossover frequency in an isolated feedback loop. The current transfer ratio is actively compensated for increases and decreases due to temperature and aging. The present invention also compensates for initial gain variations from device-to-device in the optocoupler gain.

A dynamic load is provided in parallel to the gain setting resistor of the optocoupler's drive circuit. The dynamic load varies the effective impedance of the gain setting resistor based on the gain of the optocoupler.

In the present invention, the gain setting resistor has an effective value that is raised when the current transfer ratio increases and is decreased as the current transfer ratio decreases. This results in the overall gain of the circuit being held constant and independent of the current transfer gain.

The present invention accomplishes the advantages set forth above, in the preferred embodiment, by a small number of parts added to the feedback circuit to establish a constant crossover frequency feedback loop.

DETAILED DESCRIPTION OF THE PREFERRED EMBODIMENTS

Figure 1:
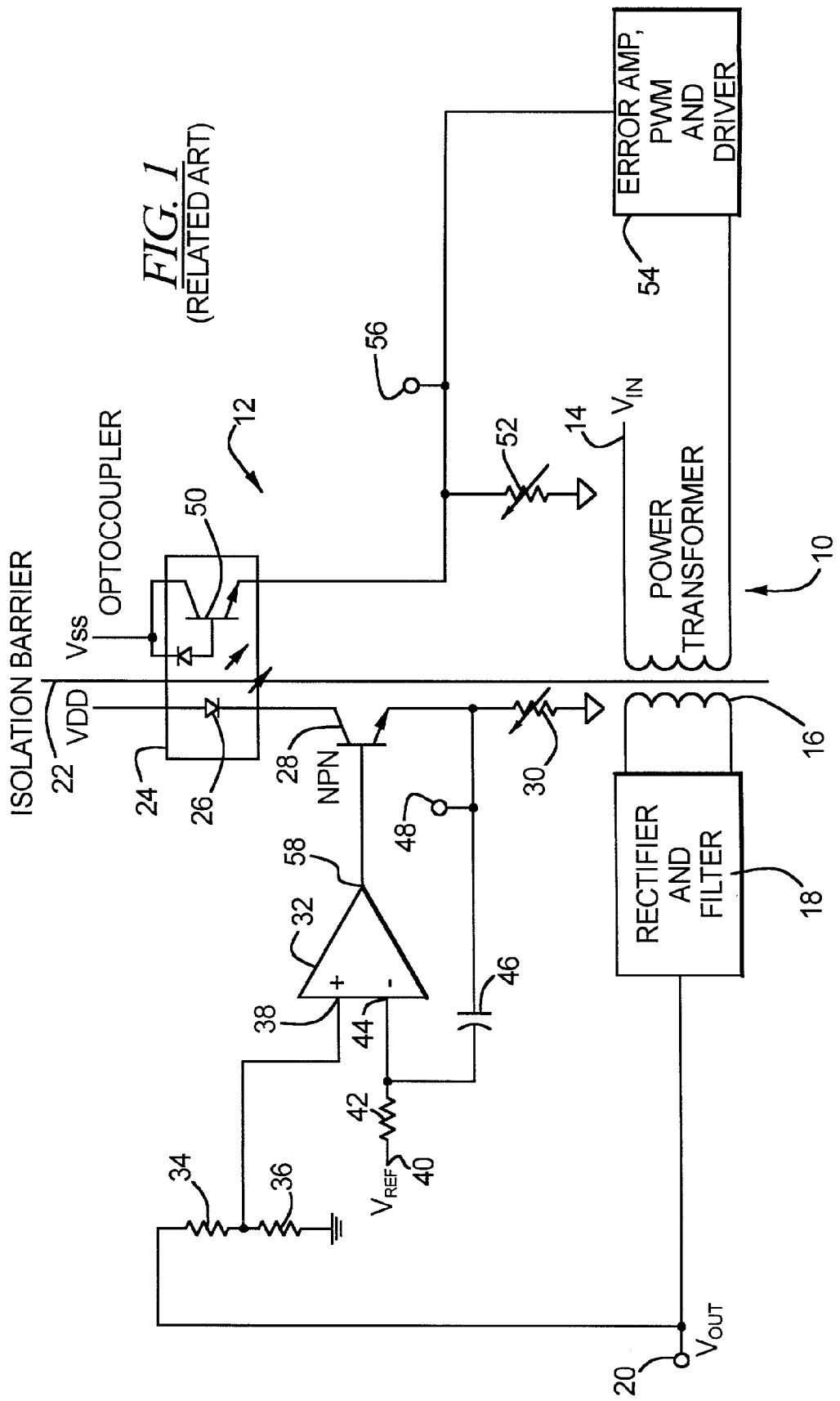
FIG. 1 is a circuit diagram of a power supply with an optocoupler and feedback loop according to a prior development.
Figure 2:
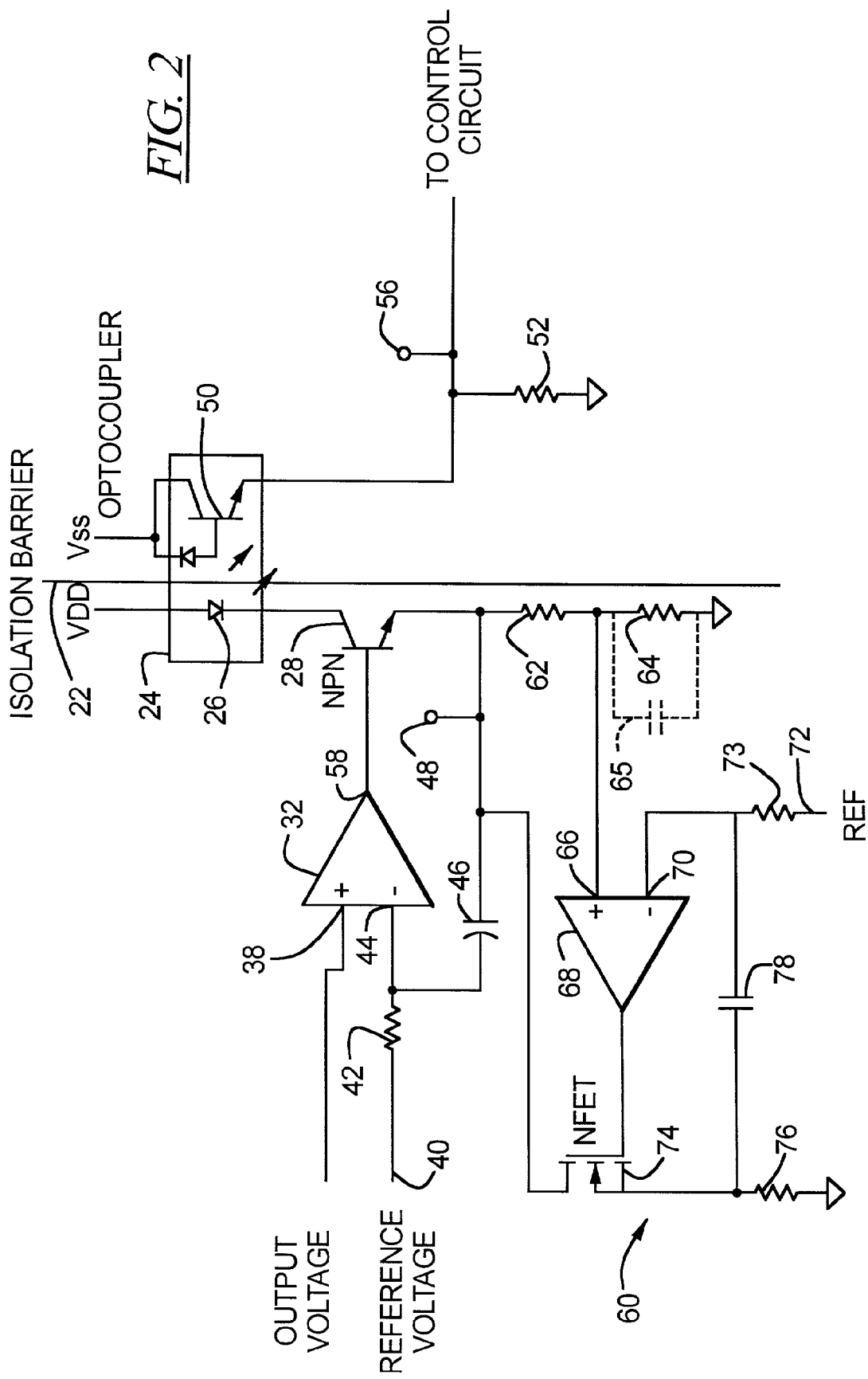
FIG. 2 is a circuit diagram of an optocoupler feedback circuit according the principles of the present invention.

In FIG. 2, only the feedback circuit is shown. The feedback circuit may be used with a power supply as shown in FIG. 1, or may be used with any other circuit for which a fixed gain feedback would benefit. The elements which are common to FIG. 1 are shown with the same reference characters. The voltage at the test point 56 to the control circuit is recognized as a fairly constant DC value. Using this assumption, a compensation is made for the variations in the current transfer ratio of the optocoupler 24. A circuit 60 is added to replace the trim resistor 30 with a resistor 62 and a resistor 64 to form a voltage divider that senses the current through the light emitting diode 26 of the optocoupler 24. The voltage at the midpoint (the physical midpoint, but not necessarily electrical midpoint) of the voltage divider 62 and 64 is connected to a non-inverting input 66 of a operational amplifier 68, the inverting input 70 of which is connected to a reference voltage 72. A resistor 73 is provided between the reference input 72 and the op-amp input 70 The operational amplifier 68 drives an active element 74, such as an NFET, that is coupled to a resistor 76 and to the test point 48. A capacitor 78 is added across the operational amplifier 68. Also, a capacitor 65 may be added across the resistor 64 in an alternative embodiment to roll off the gain of the circuit.

The circuit 60 operates to keep the voltage at the test point 48 constant by sinking (drawing off) any extra current through the active load (which is a variable resistance) formed by the FET 74 and the resistor 76. The current through the divider resistors 62 and 64 is held constant, as is the voltage across the resistor 64. Should the voltage across the resistor 64 increase, the operational amplifier 68 generates a higher output to cause the FET 74 to draw off more current. The active load, or variable resistance, of the operational amplifier 68 and the FET 74 sinks the extra load current from the optocoupler 24 and the transistor 28. The voltage gain Av from the primary to the secondary is thus constant, since Av=V56/V48. If a pulse width modulation of the control circuit of an opposite polarity is used, this gain formula would be different. The gain of the feedback circuit is therefore held constant.

A capacitor 78 is used to roll off the frequency response of the gain compensation circuit so that the circuit does not interfere with the feedback loop normal operation. In particular, the capacitor causes a low frequency operation for the circuit so that the operational amplifier 68 operates slower than the operational amplifier 32. This results in a faster change in the operating point and a slower change in the gain point. In one example, the operational amplifier 68 operates with a response time in the seconds whereas the operational amplifier 32 operates with a response time in the microseconds. Alternatively, the gain compensation circuit may be made fast to improve the power supply reaction to changes in output loads.

The resistor 76 and the voltage drop across the FET 74 are sufficiently low that the lowest current transfer ratio of an optocoupler is accommodated.

While the current sink of the circuit of FIG. 2 is through the active element, which is shown at an NFET 74, it is possible to utilize an operational amplifier which has a current carrying capacity at its output adequate to serve as the current sink. In such a circuit, the FET 74 would be eliminated and the current path would proceed through the operational amplifier 68. The active element according to the invention which serves as the current path is thus in the output circuitry of the operational amplifier.

Figure 3:
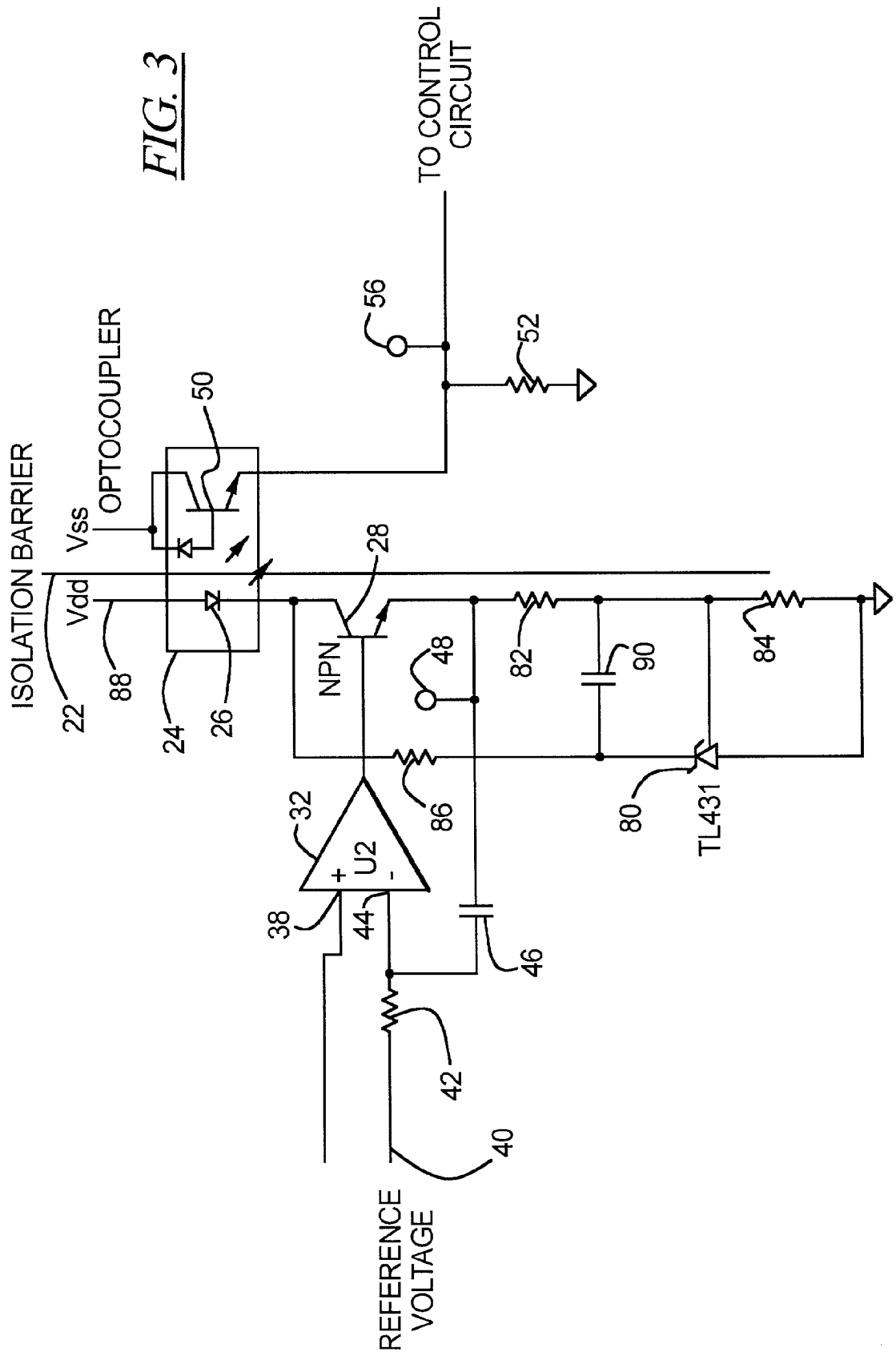
FIG. 3 is a circuit diagram of an alternative embodiment of the feedback circuit of the invention.

An alternate embodiment is shown in FIG. 3, wherein the operational amplifier 68 and FET 74 of FIG. 2 are replaced by a shunt regulator 80. The shunt regulator 80 may be a part number TL431 in one example. The shunt regulator is controlled by a voltage obtained from a voltage divider made up of resistors 82 and 84. The voltage divider is connected to receive some of the current which passes through the light emitting diode 26 of the optocoupler 24.

In the embodiment of FIG. 3, the shunt regulator 80 draws off, or sinks, a variable amount of current until the voltage across the resistor 84 of the voltage divider reaches an internal reference voltage level of the regulator 80. This results in the voltage at the voltage divider 82 and 84 being held constant by shunting the additional current through the shunt regulator 80. The voltage at the test point 48 is held constant and the gain of the optocoupler is thereby held constant. A resistor 86 is used to bias the shunt regulator 80, which is the case as long as the supply voltage Vdd at 88 across the circuit is sufficient. A frequency roll off capacitor 90 is provided as well.

As an alternative embodiment to the circuit of FIG. 3, the upper end of the resistor 86 may be connected below the transistor 28 at the test point 48, instead of the illustrated connection above the transistor 28.

Figure 4:
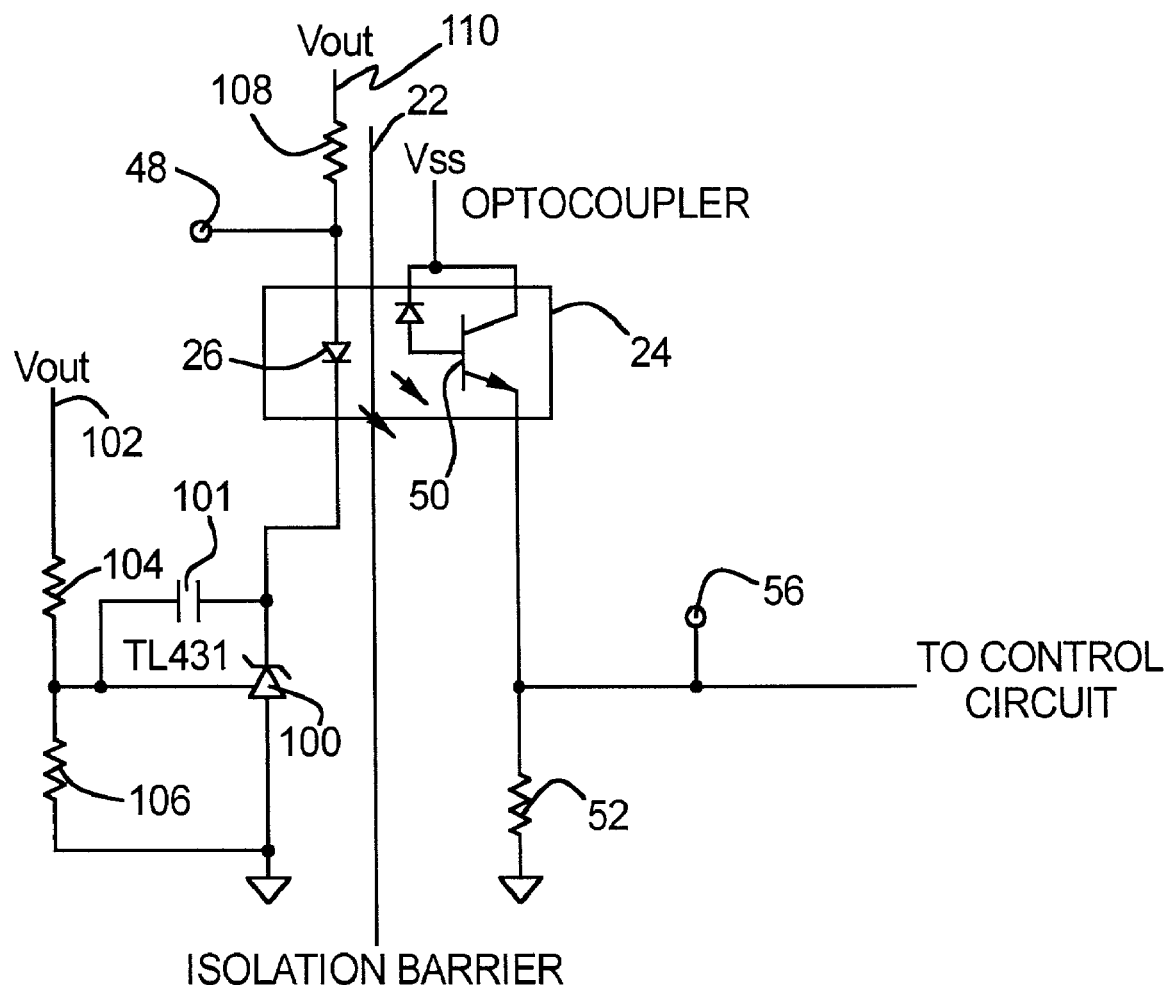
FIG. 4 is a circuit diagram of a feedback circuit for a power supply, for example, which uses a shunt regulator.
Figure 5:
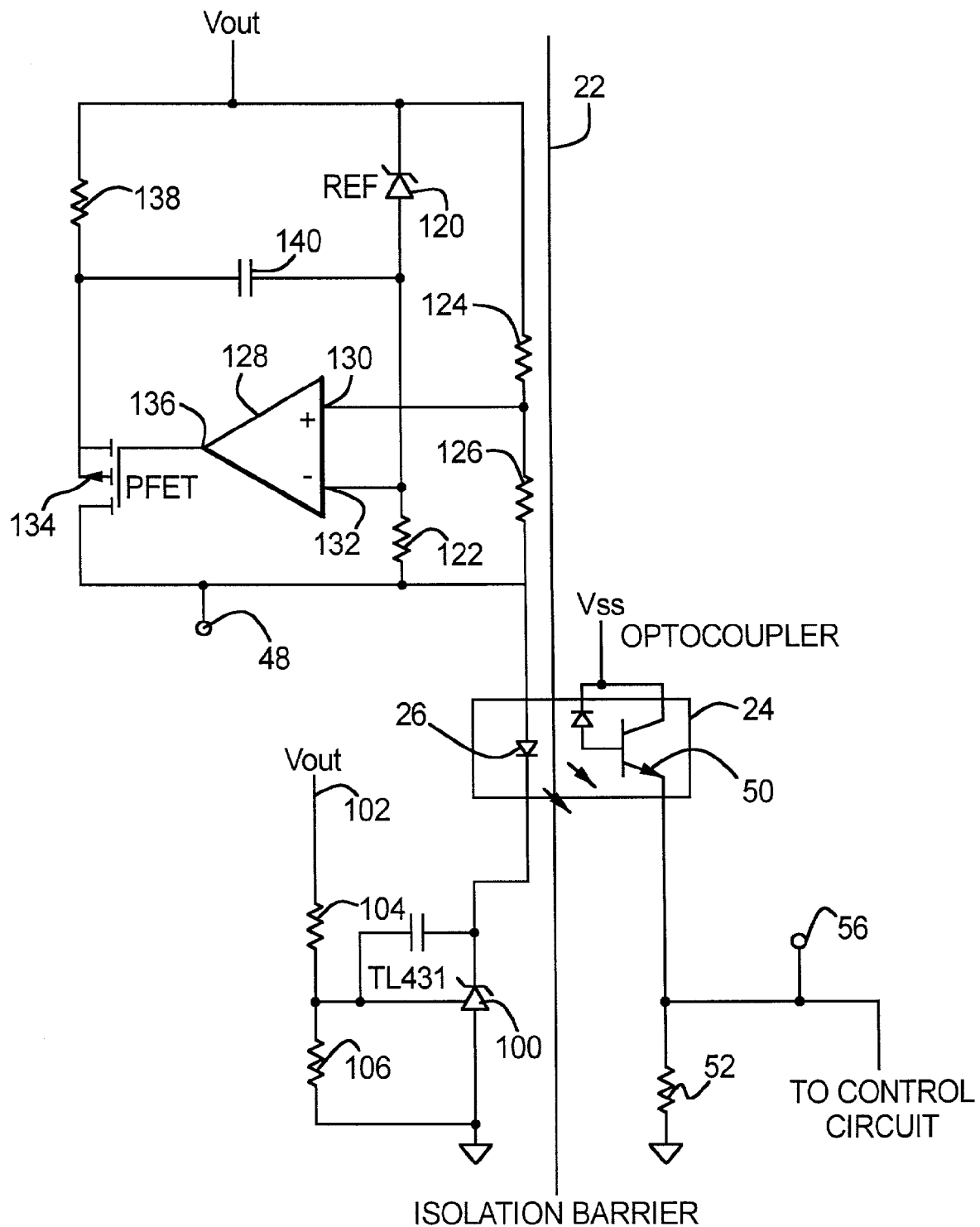
FIG. 5 is a circuit diagram of a feedback circuit using a shunt regulator as in FIG. 4 and including an active regulation according to the present invention and FIG. 6 is a circuit diagram of a further embodiment of the invention.

As an improvement on the circuit of FIG. 4, the circuit of FIG. 5 provides a feedback control loop using the shunt regulator 100, such as a TL431, to drive the optocoupler 24. The capacitor 101 maybe connected at the shunt regulator 100, as shown. A gain compensation circuit similar to that of FIG. 2 may be provided. The circuitry of the present embodiment is translated to the upper voltage rail from the lower voltage rail as in the previous embodiments.

A reference voltage device 120 is connected to define a reference voltage from current flowing from the output voltage $V_{out}$ through the reference device 120 and through a resistor 122 to the light emitting diode 26 of the optocoupler 24. The reference voltage derived from the output voltage $V_{out}$ is compared to a voltage drop across a resistor 124 of a voltage divider 124 and 126 in a operational amplifier 128. As the current through the resistor 124 increases, a non-inverting input 130 of the operational amplifier 128 becomes more negative than an inverting input 132. The output of the operational amplifier 128 goes low to turn on harder a PFET 134 at the output 136 thereof. With the PFET 134 on harder, more current is drawn through a resistor 138 and made available to the light emitting diode 26 of the optocoupler 24. This added current is also supplied to the shunt regulator 100. The result is that the control voltage for the shunt regulator 100 and the gain of the optocoupler section of the feedback loop is compensated. A capacitor 140 provides feedback compensation for the operational amplifier 128.

Figure 6:
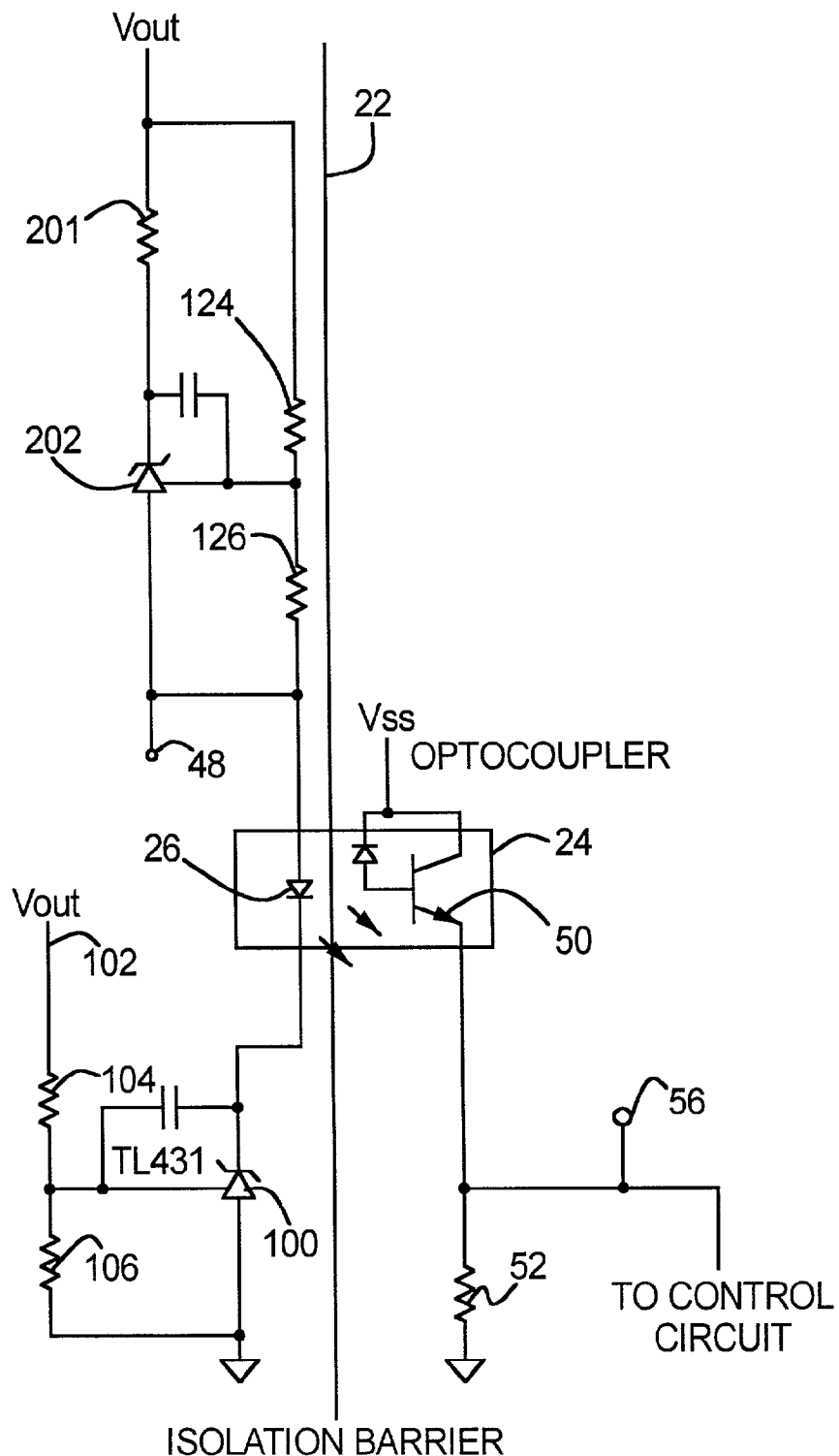

An alternative embodiment is shown in FIG. 6. The reference 120, the operational amplifier 130 and the active element 134 of FIG. 5 are replaced with a shunt regulator 202 and a biasing resistor 201. The circuit operation of the circuit of FIG. 6 provides that as the current through the resistor 126 increases, the shunt regulator 202 sinks additional current so that the voltage across the resistor 126 is held constant. This in turn means that the voltage between the output $V_{out}$ and the test point 48 is constant and that the gain of the optocoupler section of the feedback loop is compensated.

The present invention therefore provides a gain compensation to optocoupler isolated feedback loop circuits. The use of a dynamically varying load in parallel with the optocoupler gain setting resistor provides the gain compensation without resort to trimming of the gain setting resistor and without resort to sorting the optocouplers for gain to compensate for different initial optocoupler gains.

The compensation in gain variation prevents changes in the crossover frequency of the power supply or analog circuit feedback loop, even due to the effects of temperature changes and aging of the circuit elements. Improved performance of the circuit is realized.

Although other modifications and changes may be suggested by those skilled in the art, it is the intention of the inventors to embody within the patent warranted hereon all changes and modifications as reasonably and properly come within the scope of their contribution to the art.

We claim:

1. A power supply, comprising:
a power transformer having an input side and an output side;
a rectifier connected to said output side of said power transformer and having an output at which is available an output voltage;
a operational amplifier connected to said output of said rectifier and connected to a first reference value, said operational amplifier having an output;
a first active element having a control input connected to said output of said operational amplifier;
an optical coupler having an input and an output isolated from said input, said input being connected to be controlled by said first active element;
a control circuit having an input connected to said output of said optical coupler and an output connected to said input side of said power transformer;
a voltage divider connected to receive at least a portion of a current through said first active element and said input of said optical coupler;
a second active element connected to selectively draw current from said first active element and said input of said optical coupler, said second active element operating relative to a second reference value to hold a gain through said optical coupler substantially constant.

2. A power supply as claimed in claim 1, wherein said operational amplifier is a first operational amplifier, and further comprising:
a second operational amplifier connected to receive a voltage from said voltage divider and to receive said second reference value, said second operational amplifier having an output connected to a control input of said second active element.

3. A power supply as claimed in claim 1, wherein said second active element is a shunt regulator having an input connected to said voltage divider.

4. A gain controlled feedback circuit, comprising:

an optical coupler having an input and an output isolated from said input;

a first transistor connected to said input of said optical coupler;

a first operational amplifier having an output connected to a control input of said first transistor, said first operational amplifier having first and second inputs connected to a first reference value and to a value to be controlled;

a voltage divider connected to said first transistor;

a second operational amplifier having first and second inputs connected to a second reference value and to said voltage divider; and a second transistor having a control input connected to an output of said second operational amplifier, said second transistor having a controllable current path connected to said first transistor to draw off current from said voltage divider depending on gain variations of said optical coupler.

* * * * *